(12) United States Patent
Lin et al.

(10) Patent No.: US 8,094,115 B2
(45) Date of Patent: Jan. 10, 2012

(54) CIRCUIT DEVICE AND RELATED METHOD FOR MITIGATING EMI

(75) Inventors: Wen-Chi Lin, Yilan County (TW); Che-Li Lin, Taipei (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 951 days.

(21) Appl. No.: 12/058,763

(22) Filed: Mar. 31, 2008

(65) Prior Publication Data

US 2009/0115477 A1 May 7, 2009

(30) Foreign Application Priority Data

Nov. 6, 2007 (TW) ................................. 96141854 A

(51) Int. Cl.
*G09G 3/36* (2006.01)
(52) U.S. Cl. ........................... 345/99; 345/204; 327/231
(58) Field of Classification Search .................... 345/56, 345/60, 76, 82, 84, 87, 99, 100, 103, 204; 327/141, 161, 231
See application file for complete search history.

(56) References Cited

U.S. PATENT DOCUMENTS

| | | | | |
|---|---|---|---|---|
| 5,533,072 A * | 7/1996 | Georgiou et al. | ............. | 375/371 |
| 5,663,668 A * | 9/1997 | Hayashi et al. | ................ | 327/156 |
| 5,963,502 A * | 10/1999 | Watanabe et al. | .......... | 365/233.1 |
| 6,040,816 A * | 3/2000 | Uchino | ............................. | 345/99 |
| 6,320,572 B1 * | 11/2001 | Takabayashi et al. | ........ | 345/204 |
| 6,526,106 B1 * | 2/2003 | Migita | ......................... | 375/354 |
| 6,603,466 B1 * | 8/2003 | Sakaguchi et al. | ............. | 345/204 |
| 6,831,622 B2 * | 12/2004 | Aoki | ................................. | 345/87 |
| 7,030,852 B2 * | 4/2006 | Ito et al. | ........................ | 345/103 |
| 7,227,522 B2 * | 6/2007 | Fujimoto et al. | ................. | 345/87 |
| 7,280,093 B1 * | 10/2007 | Hiroki | ........................... | 345/100 |
| 7,405,604 B2 * | 7/2008 | Lin et al. | ........................ | 327/161 |
| 7,847,666 B2 * | 12/2010 | Moinian et al. | ................ | 336/200 |
| 2005/0135494 A1 * | 6/2005 | Kybett et al. | .................. | 375/260 |
| 2005/0219189 A1 | 10/2005 | Fukuo | | |
| 2007/0132701 A1 | 6/2007 | Jeon | | |
| 2007/0211010 A1 * | 9/2007 | Lin | ................................. | 345/99 |

FOREIGN PATENT DOCUMENTS

| | | |
|---|---|---|
| CN | 101051136 A | 10/2007 |
| TW | I258917 | 7/2006 |

* cited by examiner

*Primary Examiner* — Lun-Yi Lao
*Assistant Examiner* — Tom Sheng
(74) *Attorney, Agent, or Firm* — Winston Hsu; Scott Margo

(57) ABSTRACT

In order to mitigate electromagnetic interference (EMI), the present invention provides a circuit device for an electronic device including a signal generating unit, a phase adjusting unit and an output interface. The signal generating unit generates a plurality of in-phase signals. The phase adjusting unit is coupled to the signal generating unit and is used for adjusting the plurality of in-phase signals to generate a plurality of output signals, where all or some of the output signals have different phases. The output interface is coupled to the phase adjusting unit and is used for outputting the plurality of output signals to a plurality of signal processing units for image processing.

6 Claims, 14 Drawing Sheets

|        | CD1 | CD2 | CD3 | CD4 | CD5 | CD6 | CD7 | CD8 | CD9 | CD10 |
|--------|-----|-----|-----|-----|-----|-----|-----|-----|-----|------|
| Case 1 | 0   | 1   | 2   | 3   | 4   | 5   | 6   | 7   | 8   | 9    |
| Case 2 | 9   | 8   | 7   | 6   | 5   | 4   | 3   | 2   | 1   | 0    |
| Case 3 | 4   | 3   | 2   | 1   | 0   | 0   | 1   | 2   | 3   | 4    |
| Case 4 | 8   | 6   | 4   | 2   | 0   | 1   | 3   | 5   | 7   | 9    |
| Case 5 | 9   | 7   | 5   | 3   | 1   | 0   | 2   | 4   | 6   | 8    |
| Case 6 | 0   | 1   | 2   | 3   | 4   | 4   | 3   | 2   | 1   | 0    |
| Case 7 | 0   | 2   | 4   | 6   | 8   | 9   | 7   | 5   | 3   | 1    |
| Case 8 | 1   | 3   | 5   | 7   | 9   | 8   | 6   | 4   | 2   | 0    |
| Case 9 | A1  | A2  | A3  | A4  | A5  | A6  | A7  | A8  | A9  | A10  |

FIG. 12

CIRCUIT DEVICE AND RELATED METHOD FOR MITIGATING EMI

BACKGROUND OF THE INVENTION

1. Field of the Invention

The present invention relates to a circuit device and related method for mitigating electromagnetic interference (EMI), and more particularly to a circuit device and related method for mitigating EMI induced by signal transmission.

2. Description of the Prior Art

A liquid crystal display (LCD) is a flat panel display and has advantages of low radiation, light weight and low power consumption. Thus, the LCD is widely used in various information technology (IT) products, such as a notebook computer, a personal digital assistant (PDA), and a mobile phone. An active matrix thin film transistor (TFT) LCD is the mainstream in LCD families, especially in the large-size LCD family. In general, there is a driving system installed in the LCD, including a timing controller, source drivers and gate drivers. The source and gate drivers respectively control data lines and scan lines, which intersect to form a cell matrix. Each intersection is a cell including crystal display molecules and a TFT. In the driving system, the gate drivers are responsible for transmitting scan signals to gates of TFTs to turn on the TFTs on the panel. The source drivers are responsible for converting digital image data, sent by the timing controller, into analog voltage signals and outputting the voltage signals to sources of the TFTs. When the TFT receives the voltage signal, a corresponding liquid crystal molecule has a terminal whose voltage changes to equalize the drain voltage of the TFT, and thereby changes its own twist angle. The rate that light penetrates the liquid crystal molecule is accordingly changed and thus different colors can be displayed on the panel.

The timing controller mostly uses differential signaling (DS) interfaces to transfer data content to the source drivers. Common DS interfaces are multilevel differential signaling, reduced swing differential signaling (RSDS) and mini low voltage differential signaling (mini-LVDS) interfaces. The RSDS interface is characterized by two opposite current directions and an intensity level. In the multilevel differential signaling interface, the timing controller can transmit currents having different directions and multiple intensity levels. The currents generate voltages having different polarities and amplitudes on the terminal resistors of the source drivers, and thereby the source drivers can determine a type or logic state of the received voltage signal. Transmission interfacing architecture between the timing controller and the source drivers has two typical types: a bus signaling type, and a dedicated signaling type. Several source drivers share the same signaling lines to communicate with the timing controller in the bus signaling type, whereas each source driver uses independent signaling lines in the dedicated signaling type. The dedicated signaling architecture commonly has each source driver use one transistor-to-transistor (TTL) clock line and (k−1) data lines, or two DS clock lines and (k−2) data lines, where k is an integer greater than 2.

With advancements in LCD panel size, image resolution, and high data rates, the driving system needs to employ significantly large numbers of source drivers and transmission wires, which bring about non-negligible electromagnetic interference (EMI). As is well known in the art, the EMI is induced by current variation, and the EMI caused by one device negatively affects stabilization of signal transmission and processes of neighboring devices. During signal transmission, an instantaneous current having different variation rates and levels can generate different EMI degrees. The higher the variation level of the instantaneous current, the more strongly the EMI is induced.

For a driving system adopting a bus signaling architecture, since all of the source drivers jointly use a number of transmission lines, the timing controller has to simultaneously transmit interface display signals on those transmission lines, thereby causing a considerable instantaneous current. In general, the EMI is more severe in the bus signaling architecture than in the dedicated signaling architecture. Regarding a driving system adopting the dedicated signaling architecture, please refer to FIG. 1, which illustrates a schematic diagram of a driving system 10 according to the prior art. The driving system 10 includes a timing controller 100 and source drivers CD1-CD10. The timing controller 100 uses the multilevel differential signaling (DS) interface to transmit the interface display signals, which are embedded with display data content. On the other hand, each source driver receives the interface display signals via two independent DS line pairs, which are labeled by CDk_P/N, where k=1-10. The DS line pairs CDk_P/N have two DS line pairs: CDk_P and CDk_N. In addition, the DS line pair CDk_P includes DS lines CDk_0P and CDk_1P, whereas the DS line pair CDk_N includes DS lines CDk_0N and CDk_1N. In the driving system 10, the timing controller 100 transmits the interface display signals all with the same output phase on the DS line pairs CD1_P/N-CD10_P/N. As a result, all current transitions of the interface display signals occur at the same time, resulting in a significant instantaneous current variation. Please refer to FIG. 2, which illustrates a waveform diagram of the interface display signals of the DS line pairs CD1_P/N-CD10_P/N in the driving system 10. When the timing controller 100 transmits the in-phase interface display signals, as shown in FIG. 2, the current transitions on the DS line pairs CD1_P/N-CD10_P/N all happen at the same time. Assuming that an instantaneous current of level I is generated on each DS line pair, a total instantaneous current of level 10*I is generated, thereby causing severe EMI effect.

A solution of the prior art to mitigate the EMI is reducing the current levels in order to reduce the variation level of the instantaneous current. However, a large-size, high-resolution LCD has a great consumption of system currents due to a large number of signaling lines and a longer line length. Therefore, the solution has limited effectiveness.

SUMMARY OF THE INVENTION

The present invention provides a circuit device for an electronic device, and related method that can mitigate EMI by adjusting phases of signals outputted from the circuit device to another device.

The present invention discloses a circuit device for mitigating EMI for an electronic device. The circuit device includes a signal generating unit, a phase adjusting unit and an output interface. The signal generating unit is used for generating a plurality of in-phase signals. The phase adjusting unit is coupled to the signal generating unit and used for adjusting phases of the plurality of in-phase signals to generate a plurality of output signals, where some or all of the plurality of output signals have different phases from each other. The output interface is coupled to the phase adjusting unit and used for outputting the plurality of output signals to a plurality of signal processing units for signal processing.

The present invention further discloses a method of mitigating EMI for an electronic device. The method includes generating a plurality of in-phase signals, adjusting phases of the plurality of in-phase signals to generate a plurality of output signals, some or all of which have different phases from each other, and then outputting the plurality of output signals signal processing.

The present invention further discloses a circuit device for mitigating EMI for a display device. The circuit device includes a digital controller, a phase-shift controlling unit, a phase adjusting unit and a transmitter. The digital controller is used for generating a plurality of display signals and an interface timing signal. The phase-shift controlling unit is used for generating a control signal according to a predetermined phase shift amount. The phase adjusting unit is coupled to the digital controller and the phase-shift controlling unit, and used for adjusting a phase of the interface timing signal according to the control signal to generate a plurality of interface adjusting signals. The transmitter is coupled to the digital controller and the phase adjusting unit, and used for converting the plurality of display signals into a plurality of interface display signals and outputting the plurality of interface display signals according to the plurality of interface adjusting signals, to allow the plurality of output signals to wholly or partially have different output phases.

The present invention further discloses a method of mitigating EMI for an electronic device. The method includes generating a plurality of display signals and an interface timing signal, generating a control signal according to a predetermined phase shift amount, adjusting a phase of the interface timing signal according to the control signal to generate a plurality of interface adjusting signals, converting the plurality of display signals into a plurality of interface display signals, and then outputting the plurality of interface display signals according to the plurality of interface adjusting signals, to stagger all or some output phases of the plurality of interface display signals.

The present invention further discloses a method of mitigating EMI for an electronic device. The method includes generating a plurality of display signals, generating a control signal according to a predetermined phase shift amount, generating a plurality of interface adjusting signals according to the control signal and the plurality of display signals, converting the plurality of display signals into a plurality of interface display signals, and then outputting the plurality of interface display signals according to the plurality of interface adjusting signals, to stagger all or some output phases of the plurality of interface display signals.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 12 is a table of phase delays corresponding to source drivers according to FIG. 11.

DETAILED DESCRIPTION

Figure 3:
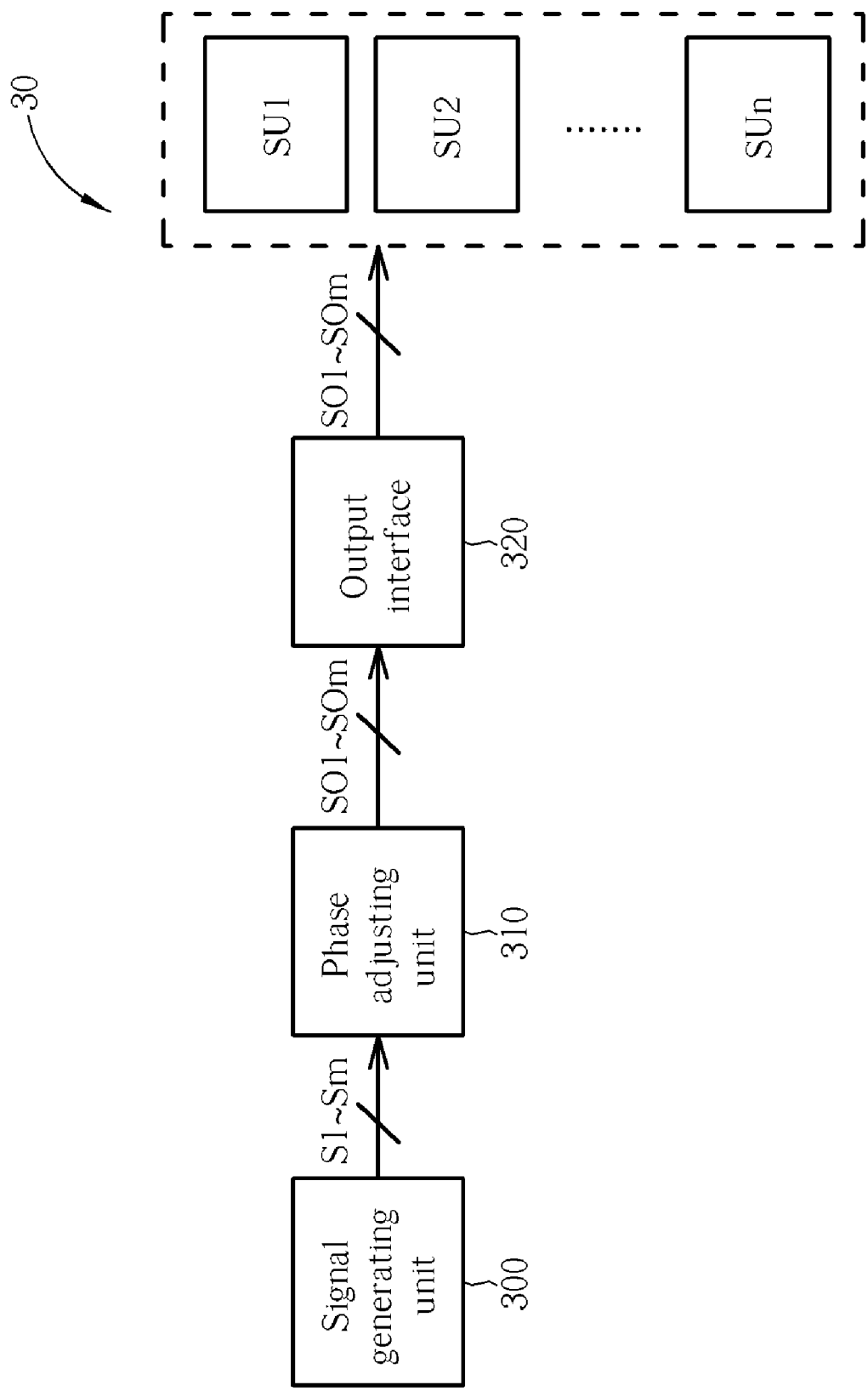
FIG. 3 is a schematic diagram of a circuit device for an electronic device according to an embodiment of the present invention.

Please refer to FIG. 3, which is a schematic diagram of a circuit device 30 for mitigating electromagnetic interference (EMI) for an electronic device according to an embodiment of the present invention. The circuit device 30 includes a signal generating unit 300, a phase adjusting unit 310 and an output interface 320. The signal generating unit 300 is used for generating in-phase signals S1-Sm. The phase adjusting unit 310 is used for adjusting phases of the in-phase signals S1-Sm to generate output signals SO1-SOm. Some or all of the output signals SO1-SOm have different phases from each other. The output interface 320 is used for outputting the output signals SO1-SOm to signal processing units SU1-SUn for signal processing. Preferably, the electronic device is a display device, and the signal processing units SU1-SUn are source drivers. In this application, the circuit device 30 may be installed in a timing controller; the output signals SO1-SOm can be control, clock or data signals. The output interface 320 includes multiple transmission line pairs coupled to the signal processing units SU1-SUn in a bus or dedicated signaling manner, and outputs the output signals SO1-SOm in a differential signal type. The signal processing units SU1-SUn perform digital-to-analog conversion, amplitude adjustment and other signal processing for the output signals SO1-SOm. With the circuit device 30, the phases of the output signals SO1-SOm can be properly adjusted to fully or partially stagger the output times of the output signals SO1-SOm. As a result, a variation level of a total instantaneous current corresponding to the output signals SO1-SOm can be significantly reduced in comparison with the prior art, which outputs the output signals SO1-SOm with the same phase. The EMI is thereby mitigated considerably.

Figure 4:
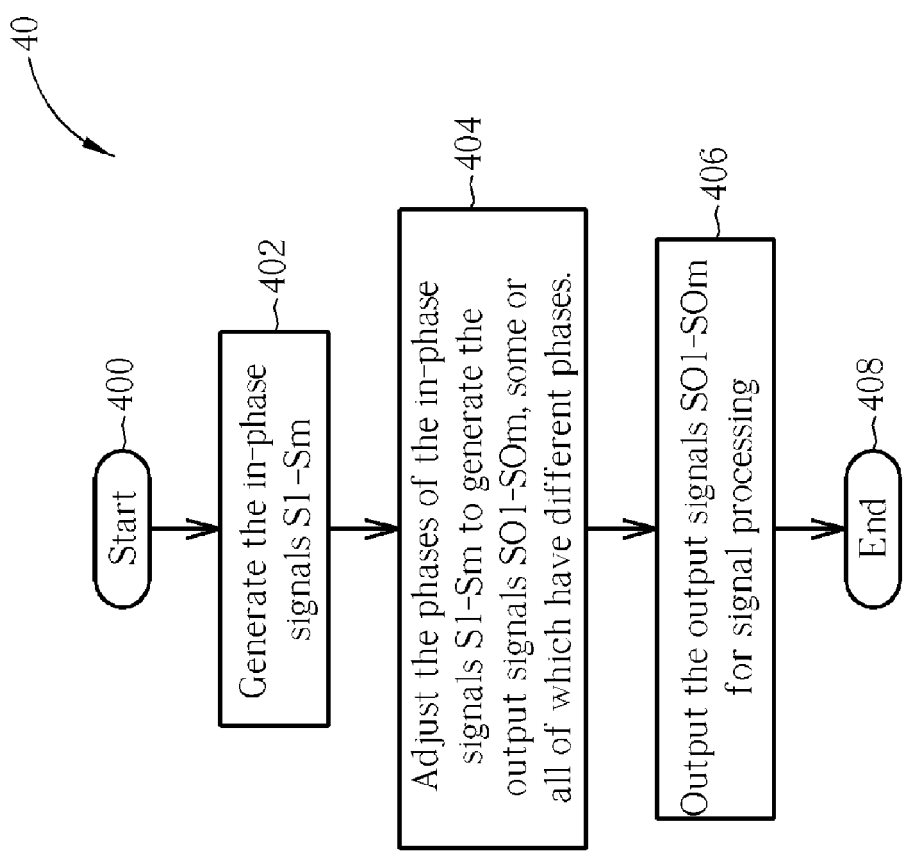
FIG. 4 is a flow chart of a process according to FIG. 3.

Please refer to FIG. 4, which is a flow chart of a process 40 according to an embodiment of the present invention. The process 40 is used to realize the circuit device 30 and includes the following steps:

Step 400: Start.

Step 402: Generate the in-phase signals S1-Sm.

Step 404: Adjust the phases of the in-phase signals S1-Sm to generate the output signals SO1-SOm, some or all of which have different phases.

Step 406: Output the output signals SO1-SOm for signal processing.

Step 408: End.

According to the process 40, the in-phase signals S1-Sm are generated, which means that the transitions of the in-phase signals S1-Sm occur simultaneously. The output signals SO1-SOm, some or all of which have different phases, are then generated by adjusting the phases of the in-phase signals S1-Sm. Preferably, the output signals SO1-SOm are generated in a differential signal form and outputted by a bus or dedicated signaling manner. As a result, the output times of the output signals SO1-SOm can be wholly or partially staggered, thereby reducing the variation level of the total instantaneous current.

Figure 1:
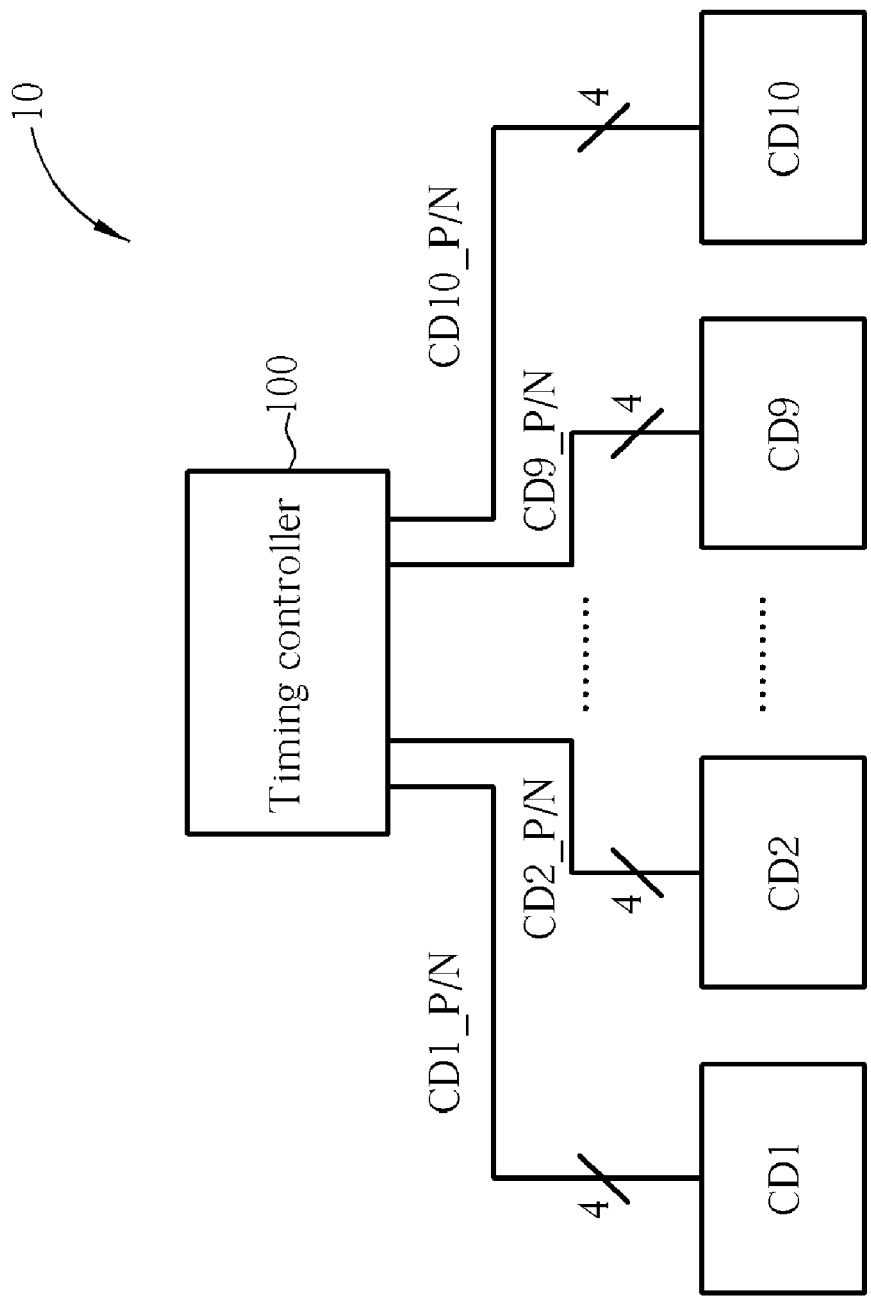
FIG. 1 illustrates a schematic diagram of a driving system of a display device according to the prior art.
Figure 2:
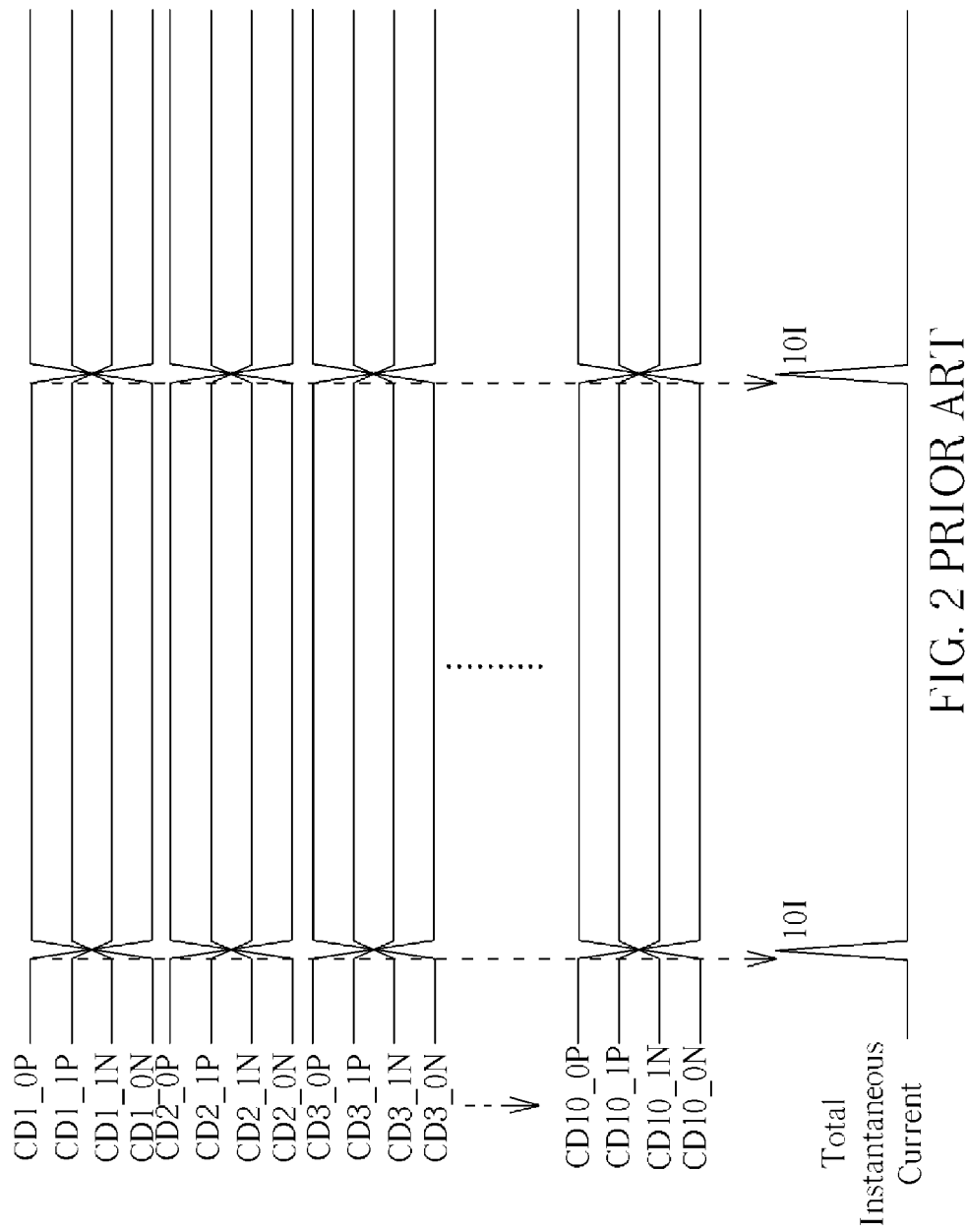
FIG. 2 illustrates a waveform diagram of interface display signals in the driving system according to FIG. 1.

More specifically, the concept of the present invention is preferably used in transmission means between a timing controller and source drivers in a display device. For simplicity, the following embodiments adopt the dedicated signaling architecture, where the coupling relationship of the timing controller and source drivers CDi can be referred from FIG. 1, where i=1-10. Each source driver receives signals from the timing controller via two differential signaling (DS) line pairs. The source driver CDi is coupled to the DS line pairs CDi_P/N. In addition, one DS line pair CDi_P includes DS lines CDi_0P and CDi_1P; the other CDi_N includes DS lines CDi_0N and CDi_1N. Preferably, the timing controller outputs data, clock or control signals in a multilevel differential signaling form, which is characterized by multiple current levels and two opposite current directions. In the following embodiments, display signals CDi_Dj, corresponding to different source drivers, are generated in the timing controller, and all have a same phase, where j=0 or a positive integer. Besides, the display signals CDi_Dj include image data, clock and control signal components. For convenience, i and j are used in the same way in the following embodiments.

Figure 5:
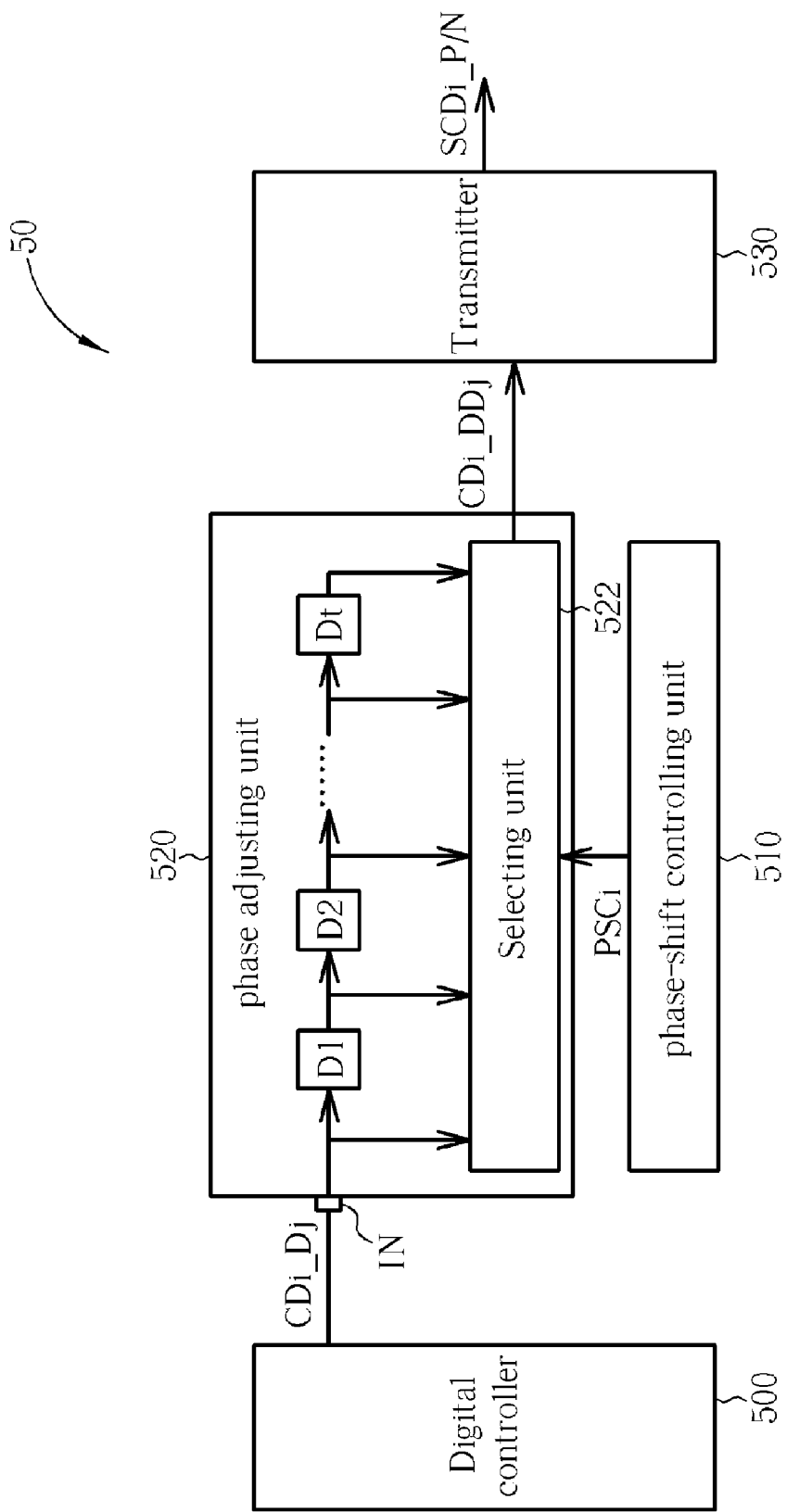
FIG. 5 is a schematic diagram of a circuit device for a display device according to a first embodiment of the present invention.

Please refer to FIG. 5, which is a schematic diagram of a circuit device 50 installed in a timing controller of a display device according to an embodiment of the present invention. The circuit device 50 is used for adjusting output times of signals outputted by the timing controller, and includes a digital controller 500, a phase-shift controlling unit 510, a phase adjusting unit 520 and a transmitter 530. The digital controller 500 is used for generating display signals CDi_Dj. The phase-shift controlling unit 510 is used for generating a control signal PSCi according to a predetermined phase shift amount, which could be different for different source drivers. The phase adjusting unit 520 is used for adjusting phases of the display signals CDi_Dj according to the control signal PSCi to generate data adjusting signals CDi_DDj. The data adjusting signals CDi_DDj are similar to the display signals CDi_Dj, including image data, clock and control signal components. The transmitter 530 is used for converting the image data component of the data adjusting signals CDi_DDj into interface display signals SCDi_P/N and outputting the interface display signals SCDi_P/N to the destination source driver. In addition, the transmitter 530 staggers all or some of the output times of the interface display signals SCDi_P/N according to the control signal component of the data adjusting signals CDi_DDj.

In FIG. 5, the phase adjusting unit 520 includes a receiving terminal IN, delay units D1-Dt and a selecting unit 522. After the receiving terminal IN receives the display signals CDi_Dj, each of the delay units D1-Dt delays the display signals CDi_Dj and thereby outputs the delayed signals to the selecting unit 522. The selecting unit 522 is preferably a multiplexer, and is used for selecting the data adjusting signals CDi_DDj from among the delayed signals according to the control signal PSCi. As known from the above, a circuit device 50 can be installed in the timing controller for each source driver and adjusts phases, as well as output times, of the interface display signals SCDi_P/N by adjusting the corresponding control signal PSCi. As a result, the total instantaneous current can be reduced due to staggered output times of signals outputted to the source drivers, thereby mitigating EMI during signal transmission.

Figure 6:
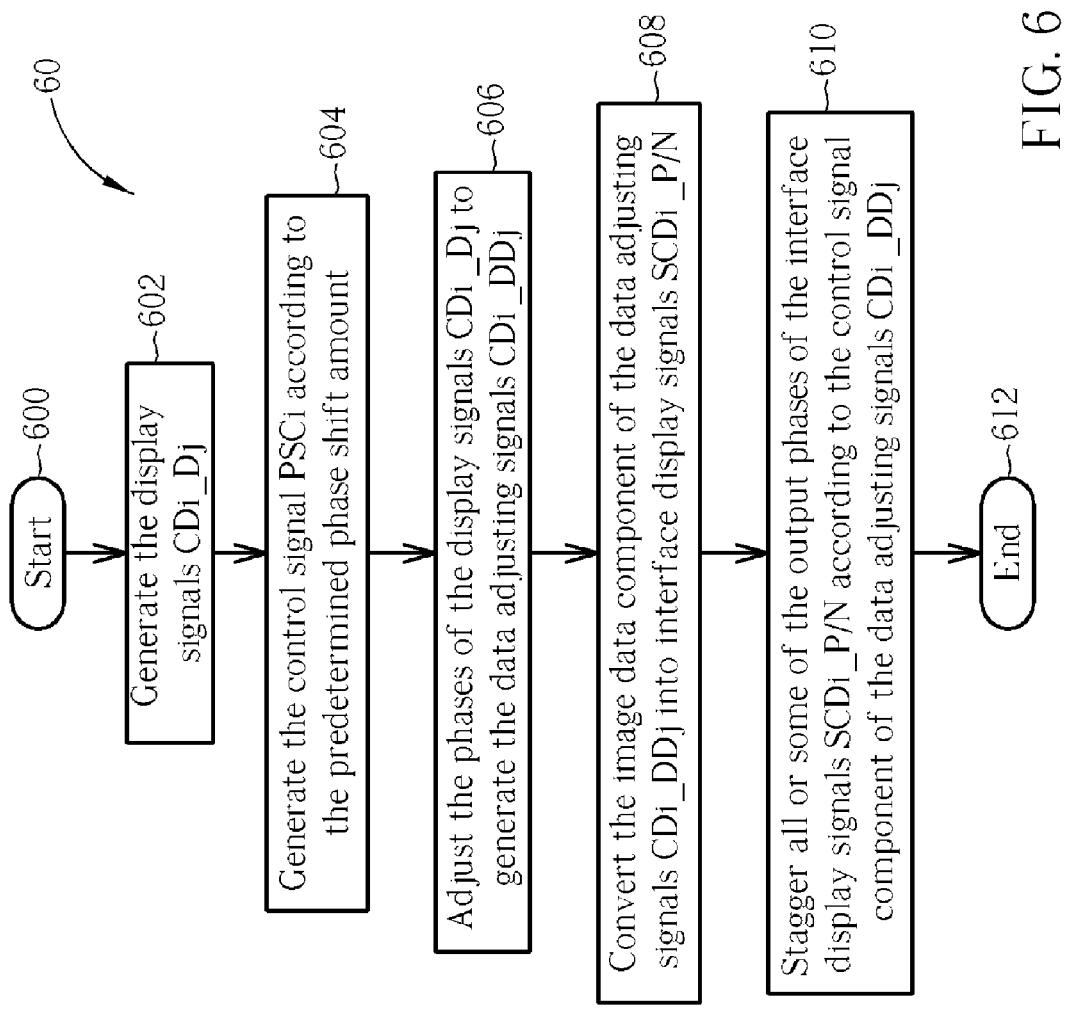
FIG. 6 is a flow chart of a process according to FIG. 5.

Please refer to FIG. 6, which is a flow chart of a process 60 according to an embodiment of the present invention. The process 60 is used to realize the circuit device 50 and includes the following steps:

Step 600: Start.
Step 602: Generate the display signals CDi_Dj.
Step 604: Generate the control signal PSCi according to the predetermined phase shift amount.
Step 606: Adjust the phases of the display signals CDi_Dj to generate the data adjusting signals CDi_DDj.
Step 608: Convert the image data component of the data adjusting signals CDi_DDj into interface display signals SCDi_P/N.
Step 610: Stagger all or some of the output phases of the interface display signals SCDi_P/N according to the control signal component of the data adjusting signals CDi_DDj.
Step 612: End.

In the process 60, for the display signals corresponding to different source drivers (ex. CD1_Dj and CD2_Dj), the predetermined phase shift amounts are separately set to be wholly or partially different so as to adjust phases of the display signals CDi_Dj. Preferably, the way to adjust the display signals CDi_Dj includes delaying the display signals CDi_Dj and then selecting the data adjusting signals CDi_DDj from among the delayed signals according to the control signal PSCi. After converting the image data component into the interface display signals SCDi_P/N, all of the interface display signals SCDi_P/N are outputted at different times. Alternatively, some of the interface display signals SCDi_P/N are outputted at different times and some are outputted at the same times. Thus, the total instantaneous current generated by outputting the interface display signals SCDi_P/N can be reduced compared with the prior art.

Figure 7:
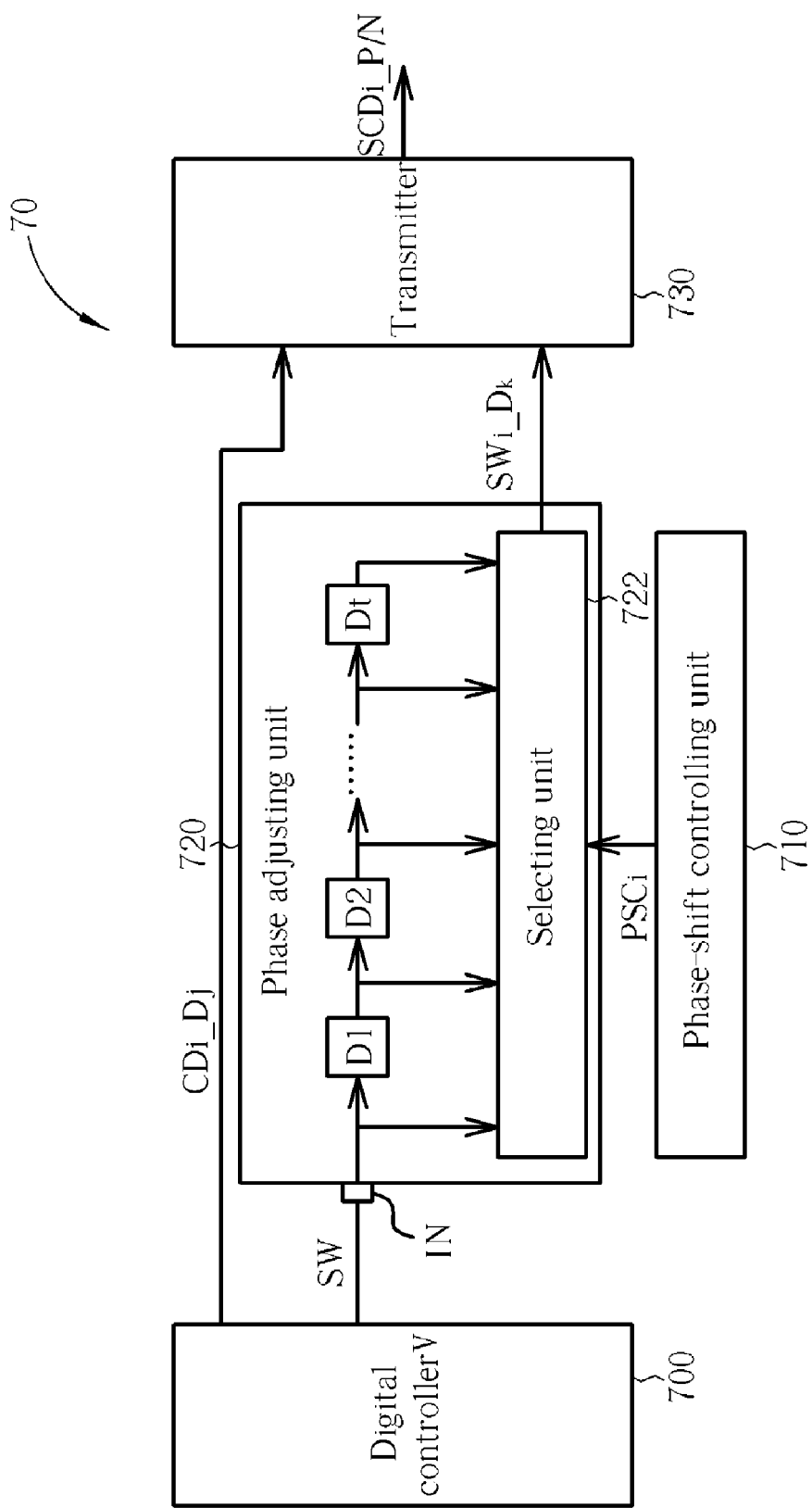
FIG. 7 is a schematic diagram of a circuit device for a display device according to a second embodiment of the present invention.

Please refer to FIG. 7, which is a schematic diagram of a circuit device 70 installed in a timing controller of a display device according to an embodiment of the present invention. The circuit device 70 includes a digital controller 700, a phase-shift controlling unit 710, a phase adjusting unit 720 and a transmitter 730. The digital controller 700 is used for generating display signals CDi_Dj and an interface timing signal SW. The phase-shift controlling unit 710 is used for generating a control signal PSCi according to a predetermined phase shift amount, which could be different for different source drivers. The phase adjusting unit 720 is used for adjusting a phase of the interface timing signal SW according to the control signal PSCi to generate interface adjusting signals Swi_Dk, where k is an non-negative integer. The transmitter 730 is used for converting the display signals CDi_Dj into interface display signals SCDi_P/N and outputting the interface display signals SCDi_P/N via DS line pairs. Furthermore, the transmitter 730 controls the interface display signals SCDi_P/N to wholly or partially have different output phases according to the interface adjusting signals SWi_Dk.

The phase adjusting unit 720 is similar to the phase adjusting unit 520 and includes a receiving terminal IN, delay units D1-Dt and a selecting unit 722. After the receiving terminal IN receives the interface timing signal SW, the delay units D1-Dt delay the interface timing signal SW to generate delay timing signals. The selecting unit 722 is preferably a multiplexer, and is used for selecting the interface adjusting signals SWi_Dk from among the delay timing signals according to the control signal PSCi. Thus, The embodiment of the present invention installs a circuit device in the timing controller for each source driver. The circuit device adds a corresponding phase shift component into the interface timing signal SW and thereby generates the interface adjusting signals SWi_Dk, which control the transmitter to output signals wholly or partially at different times.

Figure 8:
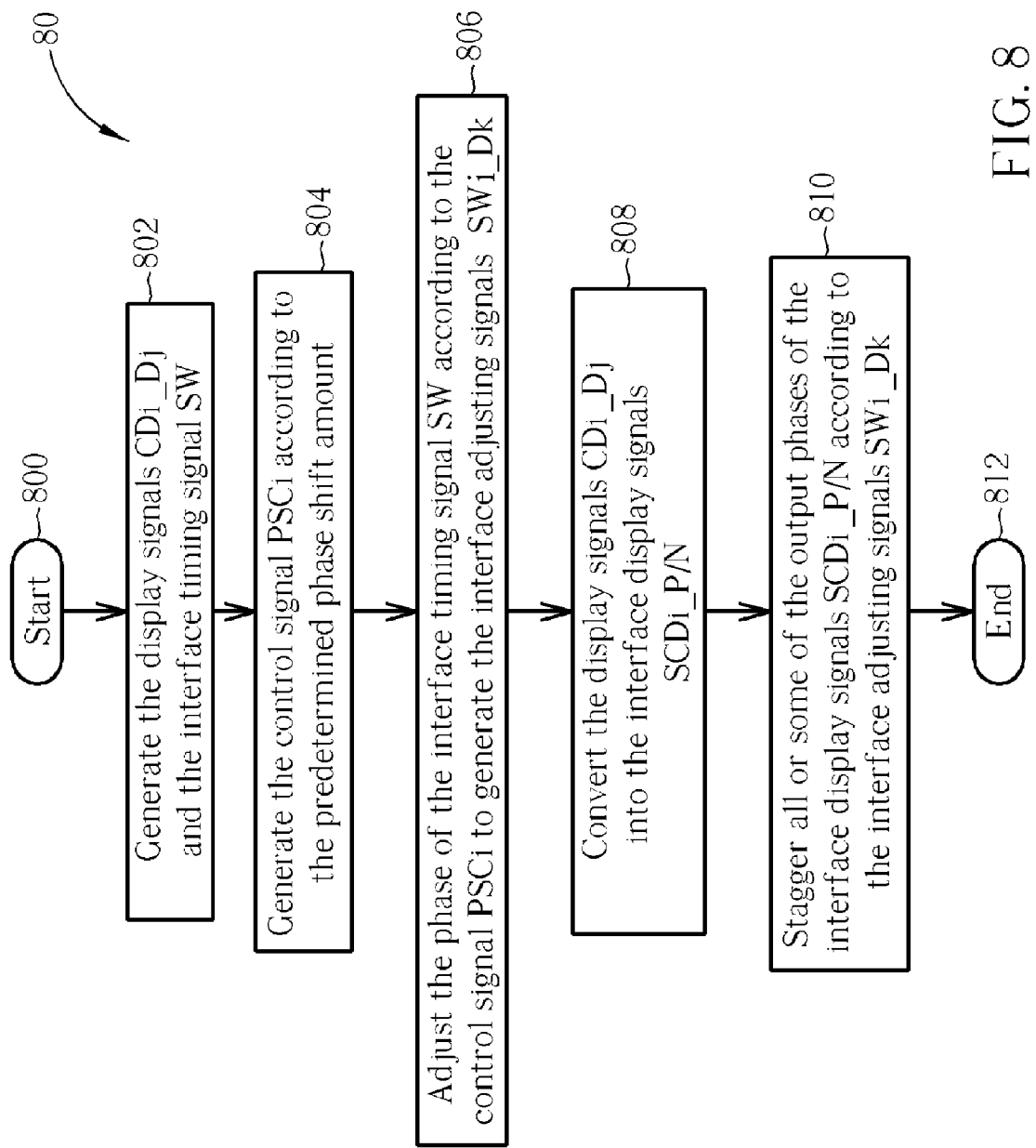
FIG. 8 is a flow chart of a process according to FIG. 7.

Please refer to FIG. 8, which is a flow chart of a process 80 according to an embodiment of the present invention. The process 80 is used to realize the circuit device 70 and includes the following steps:

Step 800: Start.

Step 802: Generate the display signals CDi_Dj and the interface timing signal SW.

Step 804: Generate the control signal PSCi according to the predetermined phase shift amount.

Step 806: Adjust the phase of the interface timing signal SW according to the control signal PSCi to generate the interface adjusting signals SWi_Dk.

Step 808: Convert the display signals CDi_Dj into the interface display signals SCDi_P/N.

Step 810: Stagger all or some of the output phases of the interface display signals SCDi_P/N according to the interface adjusting signals SWi_Dk.

Step 812: End.

According to the process 80, the display signals corresponding to different source drivers, such as CD1_Dj or CD2_Dj, are given the predetermined phase shift amount, respectively. The phases of the interface timing signal SW are then adjusted according to the control signal PSCi. Preferably, the adjustment to the phase of the interface timing signal SW includes delaying the interface timing signal SW and selecting the interface adjusting signals SWi_Dk from among the delayed versions of the interface timing signal SW according to the control signal PSCi. Thus, the interface adjusting signals SWi_Dk include delay information corresponding to the source driver CDi. After the display signals CDi_Dj are converted into the interface display signals SCDi_P/N, all or some of the interface display signals SCDi_P/N are outputted at different times. In other words, the output phases of the interface display signals SCDi_P/N are wholly or partially different.

Figure 9:
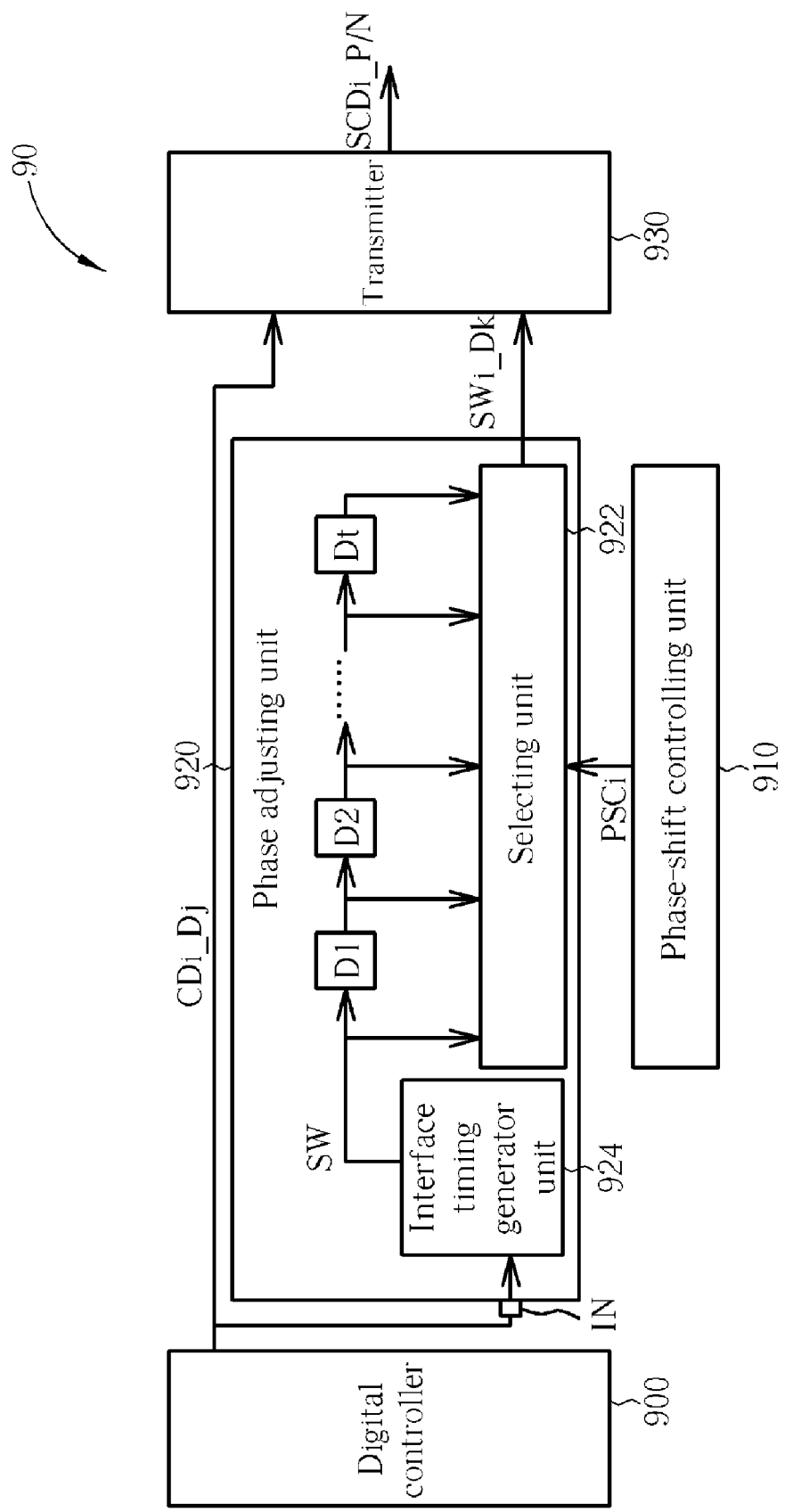
FIG. 9 is a schematic diagram of a circuit device for a display device according to a third embodiment of the present invention.

Please refer to FIG. 9, which is a schematic diagram of a circuit device 90 installed in a timing controller of a display device according to an embodiment of the present invention. The circuit device 90 includes a digital controller 900, a phase-shift controlling unit 910, a phase adjusting unit 920 and a transmitter 930. The digital controller 900 is used for generating display signals CDi_Dj. The phase-shift controlling unit 910 is used for generating a control signal PSCi according to a predetermined phase shift amount, which could be different for different source drivers. The phase adjusting unit 920 is used for generating interface adjusting signals Swi_Dk according to the control signal PSCi and the display signals CDi_Dj, where k is a non-negative integer. The transmitter 930 is used for converting the display signals CDi_Dj into interface display signals SCDi_P/N and outputting the interface display signals SCDi_P/N via DS line pairs. Furthermore, the transmitter 730 controls the interface display signals SCDi_P/N to wholly or partially have different output phases according to the interface adjusting signals SWi_Dk.

The phase adjusting unit 920 includes a receiving terminal IN, delay units D1-Dt, a selecting unit 922 and an interface timing generator unit 924. After the receiving terminal IN receives the display signals CDi_Dj, the interface timing generator unit 924 generates an interface timing signal SW according to the display signals CDi_Dj. The delay units D1-Dt delay the interface timing signal SW to generate delay timing signals. The selecting unit 922 is preferably a multiplexer, and is used for selecting the interface adjusting signals SWi_Dk from among the delay timing signals according to the control signal PSCi. Thus, the embodiment of the present invention installs a circuit device in the timing controller for each source driver. The circuit device utilizes the display signals CDi_Dj to generate the interface timing signal SW and thereby adds a corresponding phase shift component into the interface timing signal SW. The interface adjusting signals SWi_Dk control the transmitter to output signals (the interface display signals SCDi_P/N) wholly or partially at different times.

Figure 10:
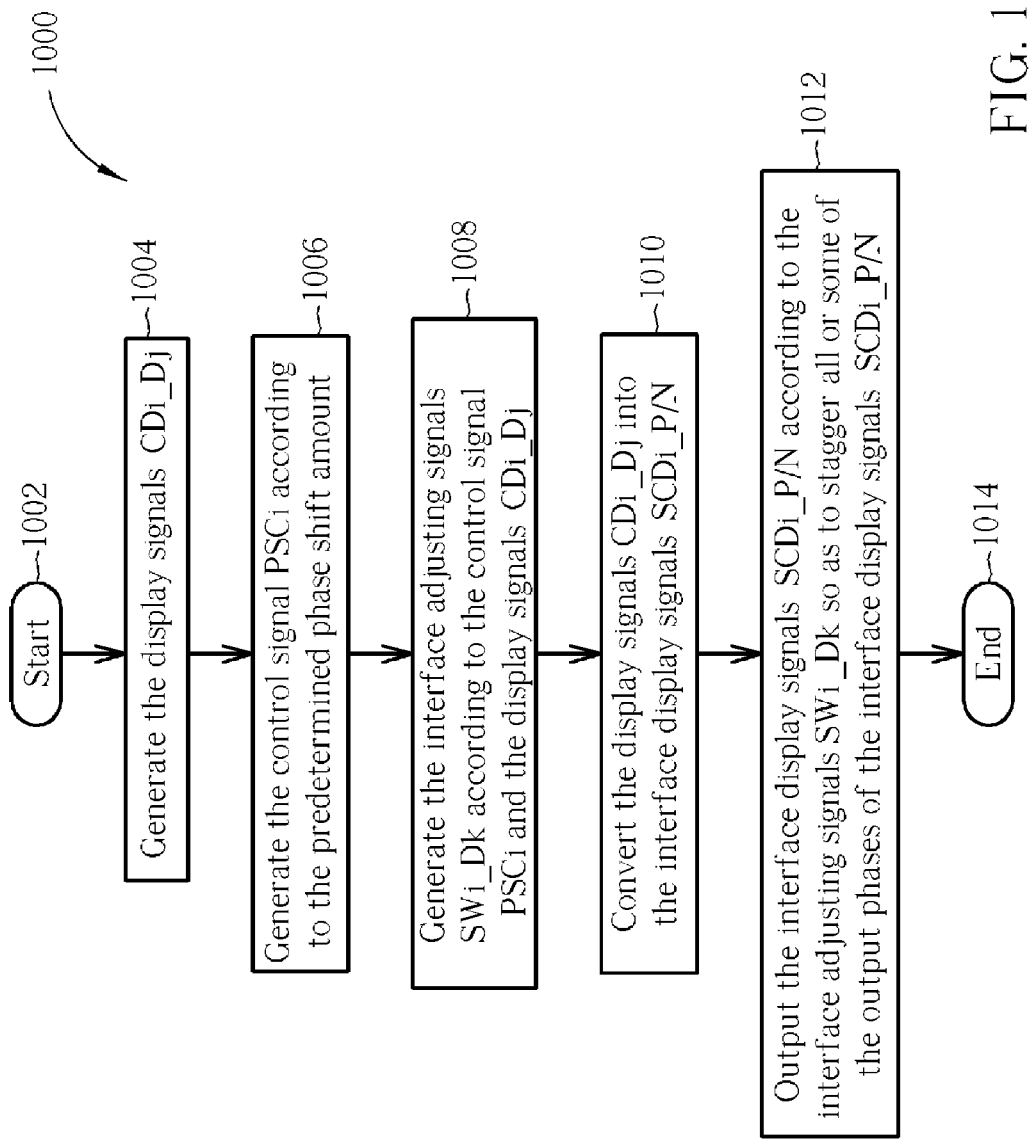
FIG. 10 is a flow chart of a process according to FIG. 9.

Please refer to FIG. 10, which is a flow chart of a process 1000 according to an embodiment of the present invention. The process 1000 is used to realize the circuit device 90 and includes the following steps:

Step 1002: Start.

Step 1004: Generate the display signals CDi_Dj.

Step 1006: Generate the control signal PSCi according to the predetermined phase shift amount.

Step 1008: Generate the interface adjusting signals SWi_Dk according to the control signal PSCi and the display signals CDi_Dj.

Step 1010: Convert the display signals CDi_Dj into the interface display signals SCDi_P/N.

Step 1012: Output the interface display signals SCDi_P/N according to the interface adjusting signals SWi_Dk so as to stagger all or some of the output phases of the interface display signals SCDi_P/N.

Step 1014: End.

According to the process 1000, the display signals corresponding to different source drivers, such as CD1_Dj or CD2_Dj, are given the predetermined phase shift amount, respectively. Different delayed versions of the interface adjusting signals SWi_Dk are thereby generated. Preferably, an interface timing signal SW is generated according to the display signals CDi_Dj. The interface timing signal SW is then delayed to generate delay timing signals. Finally, the interface adjusting signals SWi_Dk are selected from among the delay timing signals according to the control signal PSCi. Thus, the interface adjusting signals SWi_Dk include delay information corresponding to the source driver CDi. After the display signals CDi_Dj are converted into the interface display signals SCDi_P/N, all or some of the interface display signals SCDi_P/N are staggered to output at different times. In other words, the output phases of the interface display signals SCDi_P/N are wholly or partially different.

Figure 11:
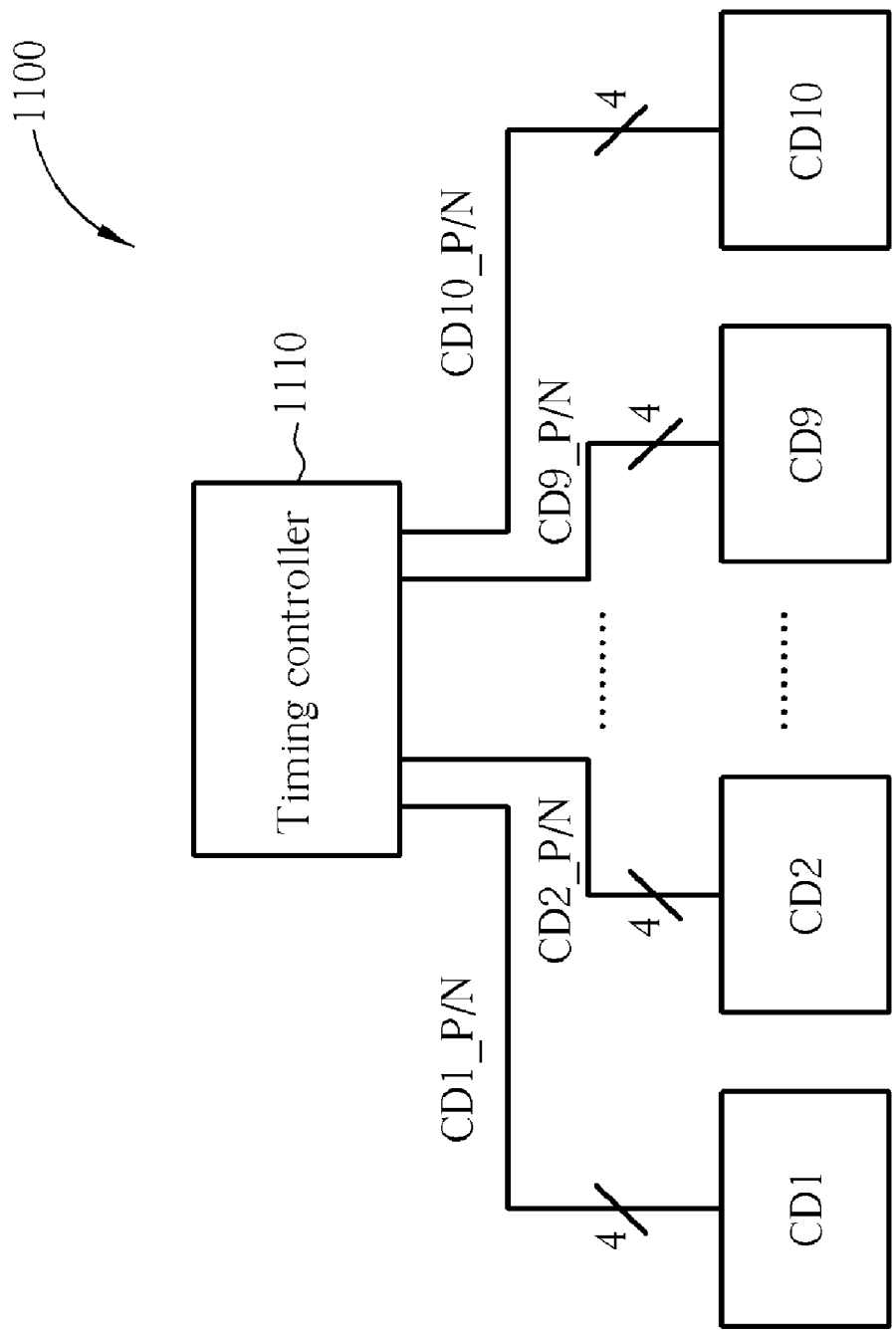
FIG. 11 illustrates a schematic diagram of a display device according to an embodiment of the present invention.

Please refer to FIG. 11, which is a schematic diagram of a display device 1100 according to an embodiment of the present invention. The display device 1100 adopts the dedicated signaling architecture and includes a timing controller 1110 and source drivers CD1-CD10. DS line pairs CD1_P/N-CD10_P/N are paved to couple the timing controller 1110 with the source drivers CD1-CD10, respectively. The DS line pair CDi_P includes DS lines CDi_0P and CDi_1P, while the DS line pair CDi_N includes DS lines CDi_0N and CDi_1N, where i=1-10. When the embodiments of FIGS. 5-10 are employed in the display device 1100, the DS line pairs CD1_P/N-CD10_P/N are utilized to transmit the interface display signals SCDi_P/N. The timing controller 1110 uses the multilevel DS interface to output image data, clock and control signals, and can further adjust the output times of signals transmitted on the DS line pairs CD1_P/N-CD10_P/N. As can be seen in FIG. 11, the DS line pairs corresponding to the source drivers CD1-CD10 have a length relationship of CD5=CD6<CD4=CD7<CD3=CD8<CD2=CD9<CD1=CD10.

Please refer to FIG. 12, which is a table of phase delays according to FIG. 11. FIG. 12 shows cases 1-9 of phase delay arrangements for the source drivers CD1-CD10, where means of producing the phase delays are detailed in the above-mentioned embodiments. In the case 1, the output signals corresponding to the source driver CD1 are not delayed, where the output signals corresponding to the source driver CD2-10 are accumulatively delayed with a delay unit time. Thus, (i−1) delay unit time may be set for the source driver CDi. In the case 2, (10−i) delay unit time may be set for the source driver CDi. In the case 3, the same amount of delay unit times is set for the source drivers having the same length DS lines, and a larger amount of delay unit times is set for the source drivers having the longer DS lines. Thus, (5−i) delay unit time may be set for the source driver CDi for i=1-5, while (i−6) delay unit time may be set for the source driver CDi for i=6-10. In the case 4, (2×(5−i)) delay unit time may be set for the source driver CDi for i=1-5, while (2×(i−6)+1) delay unit time may be set for the source driver CDi for i=6-10. In the case 5, (2×(5−i)+1) delay unit time may be set for the source driver CDi for i=1-5, while (2×(i−6)) delay unit time may be set for the source driver CDi for i=6-10. In the case 6, (i−1) delay unit time may be set for the source driver CDi for i=1-5, while (10−i) delay unit time may be set for the source driver CDi for i=6-10. In the case 7, (2×(i−1)) delay unit time may be set for the source driver CDi for i=1-5, while (2×(10−i)+1) delay unit time may be set for the source driver CDi for i=6-10. In the case 8, (2×(i−1)+1) delay unit time may be set for the source driver CDi for i=1-5, while (2×(10−i)) delay unit time may be set for the source driver CDi for i=6-10. In addition, in the case 9, the delay phases A1-A10 may be set according to system architecture in order to provide the output signals of the timing controller with a most proper delay set which can provide good effectiveness in EMI mitigation.

Figure 13:
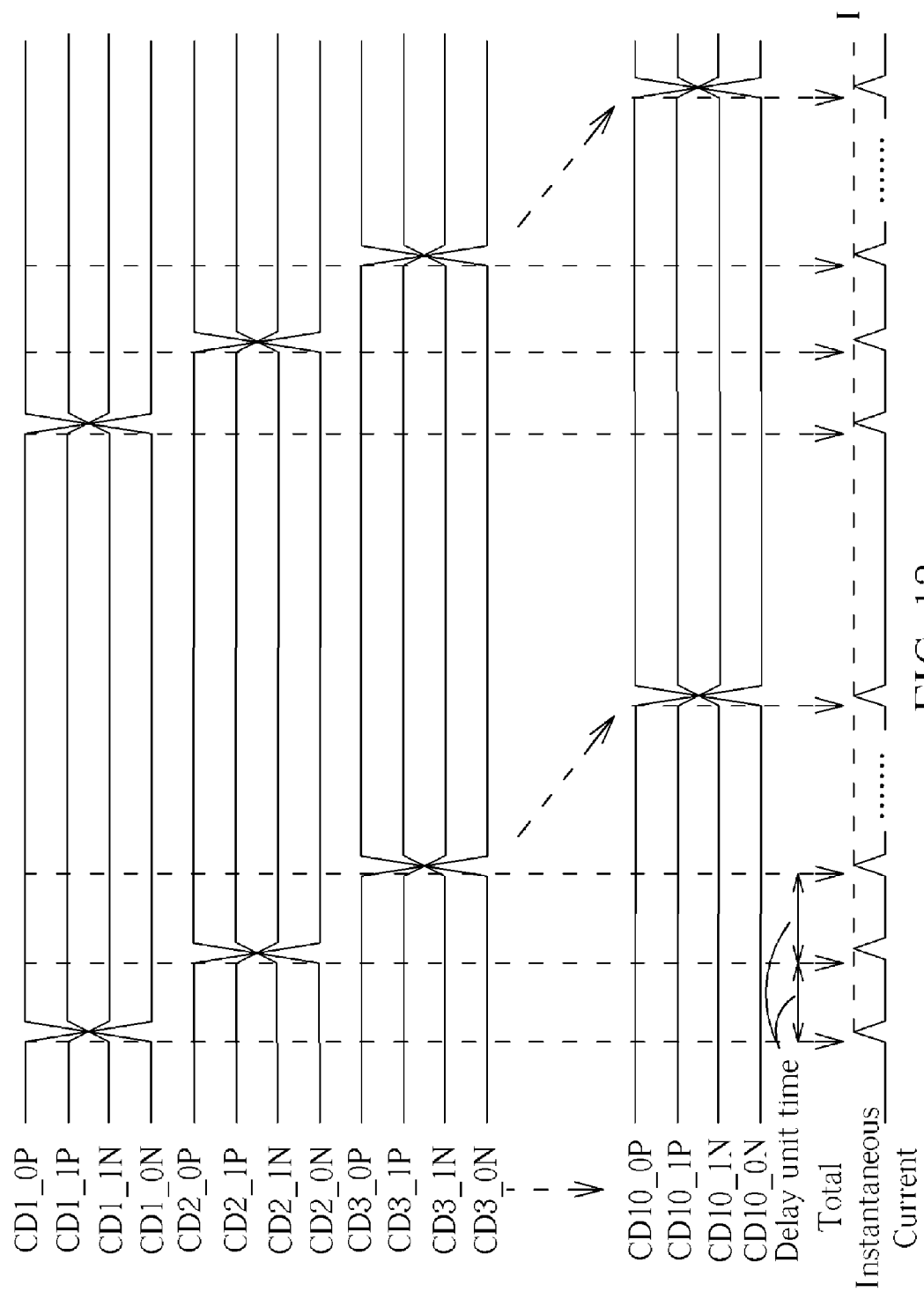
FIG. 13 is a waveform diagram of output signals transmitted on the DS line pairs according to FIGS. 11 and 12.

Please refer to FIG. 13, which is a waveform diagram of output signals transmitted on the DS line pairs CD1_P/N-CD10_P/N according to FIGS. 11 and 12. Please note that each source driver uses four DS lines. For example, the source driver CD1 uses the DS lines CD1_0P, CD1_1P. CD1_1N and CD1_0N. FIG. 13 shows signal waveforms corresponding to the case 1, in which (i−1) delay unit time may be set for the source driver CDi for i=1-10. The output times, as well as output phases, of the signals related to different source drivers are staggered, so that the transition times of the output signals are wholly staggered. Assuming that a DS line pair (ex. CD1_P/N) generates an instantaneous current whose level is I, the maximum of a total instantaneous current in this embodiment is I. Thus, the embodiment of the present invention can obviously mitigate the EMI, compared to the total instantaneous current of 10*I in the prior art.

Figure 14:
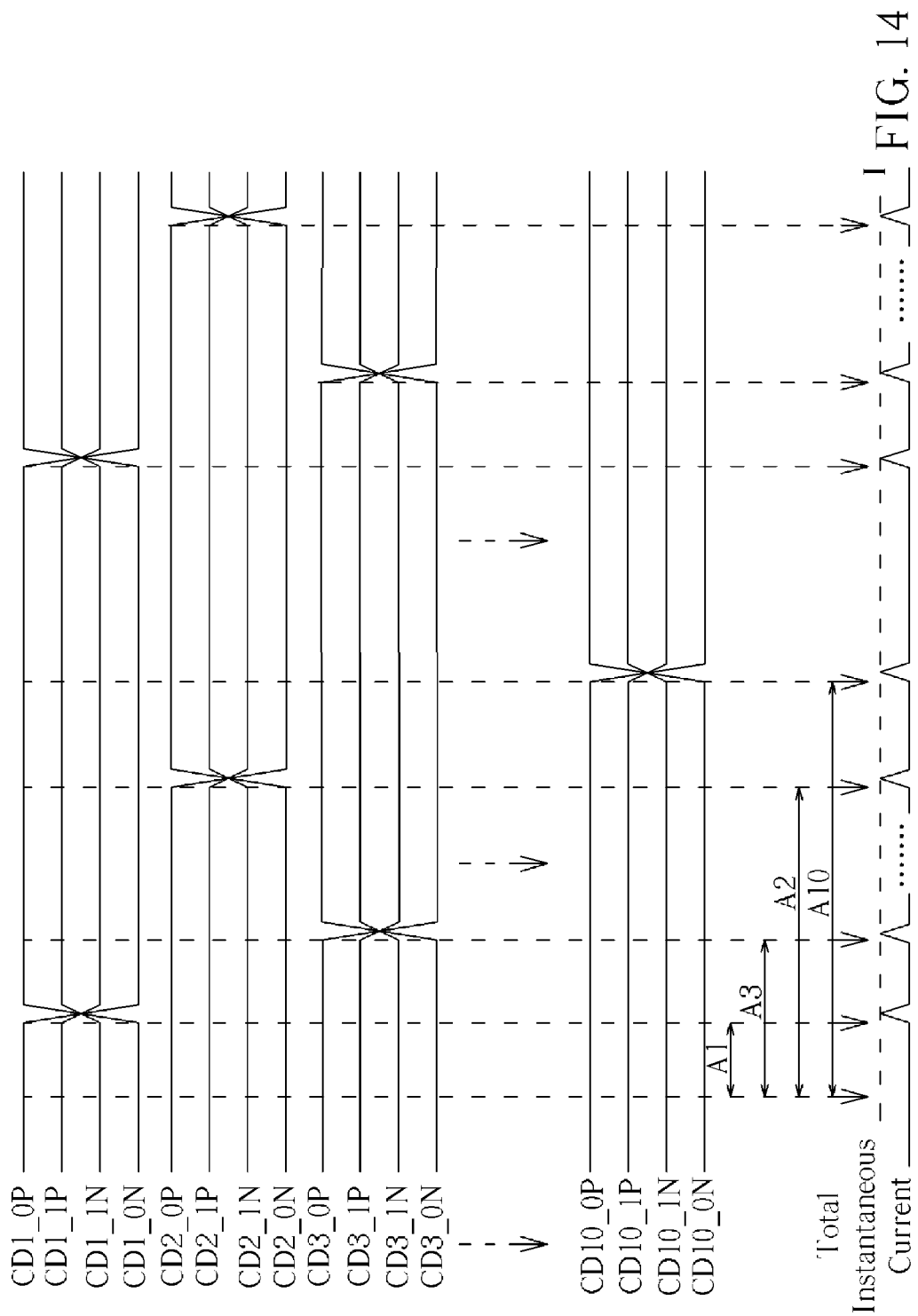
FIG. 14 is a waveform diagram of output signals transmitted on the DS line pairs according to FIGS. 11 and 12.

For a further example, please refer to FIG. 14, which is a waveform diagram of output signals transmitted on the DS line pairs CD1_P/N-CD10_P/N according to FIGS. 11 and 12. The case 9 of FIG. 12 is adopted in FIG. 14. A1 represents the delay time set for output signals corresponding to the source driver CD1; A3 represents the delay time set for output signals corresponding to the source driver CD3, and so on. Thus, in this embodiment, the output signals sent on the DS line pairs coupled to different source drivers are wholly staggered, so that the total instantaneous current is maximally 1.

In conclusion, the embodiments of the present invention provide circuit devices and related methods that adjust output phases of the signal outputted from the timing controller. Therefore, the output times of the signal are wholly or partially different to mitigate the EMI effect.

Those skilled in the art will readily observe that numerous modifications and alterations of the device and method may be made while retaining the teachings of the invention.

What is claimed is:

1. A circuit device for mitigating electromagnetic interference (EMI) for a display device, the circuit device comprising:
   a digital controller for generating a plurality of display signals and an interface timing signal;
   a phase-shift controlling unit for generating a control signal according to a predetermined phase shift amount;
   a phase adjusting unit coupled to the digital controller and the phase-shift controlling unit, for adjusting a phase of the interface timing signal according to the control signal to generate a plurality of interface adjusting signals, comprising:
      a receiving terminal for receiving the interface timing signal;
      a plurality of delay units, cascaded in a sequence and coupled to the receiving terminal for delaying the interface timing signal to generate a plurality of delay timing signals; and
      a selecting unit coupled to the receiving terminal and an output terminal of each delay unit, for selecting the plurality of interface adjusting signals from among the plurality of delay timing signals according to the control signal; and
   a transmitter coupled to the digital controller and the phase adjusting unit, for converting the plurality of display signals into a plurality of interface display signals and outputting the plurality of interface display signals according to the plurality of interface adjusting signals to stagger some output phases of the plurality of interface display signals.

2. The circuit device of claim 1, wherein the plurality of display signals are differential signals.

3. A method of mitigating electromagnetic interference (EMI) for a display device, the method comprising:
   generating a plurality of display signals and an interface timing signal;
   generating a control signal according to a predetermined phase shift amount;
   adjusting a phase of the interface timing signal according to the control signal to generate a plurality of interface adjusting signals;
   delaying the interface timing signal to generate a plurality of delay timing signals;
   selecting the plurality of interface adjusting signals from among the plurality of delay timing signals according to the control signal;
   converting the plurality of display signals into a plurality of interface display signals; and
   outputting the plurality of interface display signals according to the plurality of interface adjusting signals to stagger some output phases of the plurality of interface display signals.

4. The method of claim 3, wherein the plurality of display signals are differential signals.

5. A method of mitigating electromagnetic interference (EMI) for a display device, the method comprising:
   generating a plurality of display signals;
   generating a control signal according to a predetermined phase shift amount;
   generating an interface timing signal according to the plurality of display signals;
   delaying the interface timing signal to generate a plurality of delay timing signals;
   selecting a plurality of interface adjusting signals from among the plurality of delay timing signals according to the control signal;

converting the plurality of display signals into a plurality of interface display signals; and outputting the plurality of interface display signals according to the plurality of interface adjusting signals to stagger some output phases of the plurality of interface display signals.

6. The method of claim 5, wherein the plurality of display signals are differential signals.

* * * * *